(12) United States Patent
Wang et al.

(10) Patent No.: US 11,296,503 B1
(45) Date of Patent: Apr. 5, 2022

(54) ELECTROSTATIC DISCHARGE PROTECTION CIRCUITS AND SEMICONDUCTOR CIRCUITS

(71) Applicant: Vanguard International Semiconductor Corporation, Hsinchu (TW)

(72) Inventors: Yu-Kai Wang, Hsinchu (TW); Chang-Min Lin, Taichung (TW); Jian-Hsing Lee, Puzih (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 17/136,485

(22) Filed: Dec. 29, 2020

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01)

(58) Field of Classification Search
CPC .......................... H02H 9/046; H01L 27/0248
USPC .......................................................... 361/56
See application file for complete search history.

(56) References Cited

U.S. PATENT DOCUMENTS

| 10,790,277 | B2 * | 9/2020 | Maeda | ................ H01L 23/5286 |
| 2015/0270258 | A1 * | 9/2015 | Dabral | ..................... H02H 3/20 361/56 |

* cited by examiner

Primary Examiner — Dharti H Patel
(74) Attorney, Agent, or Firm — Birch, Stewart, Kolasch & Birch, LLP

(57) ABSTRACT

An electrostatic discharge protection (ESD) circuit is provided for a semiconductor element. The semiconductor element includes first and second drain/source electrodes and is surrounded by a deep well region. The ESD circuit includes a first control circuit and a first discharge circuit. The first control circuit is electrically connected between the first drain/source electrode and a power terminal and includes a first control terminal electrically connected to the deep well region and generates a first control signal. The first discharge circuit is controlled by the first control signal. When an electrostatic discharge event occurs on the first drain/source electrode, the first control circuit generates the first control signal according to potential states of the deep well region and the first drain/source electrode, and the first discharge circuit provides a first discharge path between the first drain/source electrode and the power terminal according to the first control signal.

22 Claims, 5 Drawing Sheets

ELECTROSTATIC DISCHARGE PROTECTION CIRCUITS AND SEMICONDUCTOR CIRCUITS

BACKGROUND OF THE INVENTION

Field of the Invention

The present invention relates to a semiconductor circuit, and more particularly to an electrostatic discharge protection circuit.

Description of the Related Art

With the development of manufacturing processes of semiconductors and integrated circuits, the size of semiconductor components has been reduced to the sub-micron level to improve the performance and operation speed of the integrated circuits. However, the reduction of the size of the components has caused some reliability problems. In particular, in integrated circuits, protection against electrostatic discharge (ESD) is seriously affected. When the size of components is reduced due to an advanced processing technology, the protection against electrostatic discharge is also reduced a lot, resulting in a significant reduction in the ESD tolerance of the components. Therefore, an electrostatic discharge protection circuit is needed to protect components from being damaged by electrostatic discharge. However, conventional electrostatic discharge protection circuits comprise a capacitor-resistor circuit occupying a large area, which is not conducive to the reduction of the size of integrated circuits.

BRIEF SUMMARY OF THE INVENTION

An exemplary embodiment of an electrostatic discharge protection circuit is provided for a semiconductor element. The semiconductor element comprises a first drain/source electrode and a second drain/source electrode. The semiconductor element is surrounded by a deep well region. The electrostatic discharge protection circuit comprises a first control circuit and a first discharge circuit. The first control circuit is electrically connected between the first drain/source electrode of the semiconductor element and a power terminal. The first control circuit comprises a first control terminal. The first control terminal is electrically connected to the deep well region. The first control circuit generates a first control signal. The first discharge circuit is electrically connected between the first drain/source electrode and the power terminal and controlled by the first control signal. When an electrostatic discharge event occurs on the first drain/source electrode, the first control circuit generates the first control signal according to a potential state of the deep well region and a potential state of the first drain/source electrode, and the first discharge circuit provides a first discharge path between the first drain/source electrode and the power terminal according to the first control signal.

An exemplary embodiment of a semiconductor circuit is provided. The semiconductor circuit comprises a semiconductor element, a first control circuit, and a first discharge circuit. The first control circuit is electrically connected between the first drain/source electrode of the semiconductor element and a power terminal. The first control circuit comprises a first control terminal. The first control terminal is electrically connected to the deep well region. The first control circuit generates a first control signal. The second discharge circuit is electrically connected between the second drain/source electrode and the power terminal and controlled by the second control signal. When the electrostatic discharge event occurs on the second drain/source electrode, the second control circuit generates the second control signal according to the potential state of the deep well region and a potential state of the second drain/source electrode, and the second discharge circuit provides a second discharge path between the second drain/source electrode and the power terminal according to the second control signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated model of carrying out the invention. This description is made for the purpose of illustrating the general principles of the invention and should not be taken in a limiting sense. The scope of the invention is best determined by reference to the appended claims.

Figure 1A:
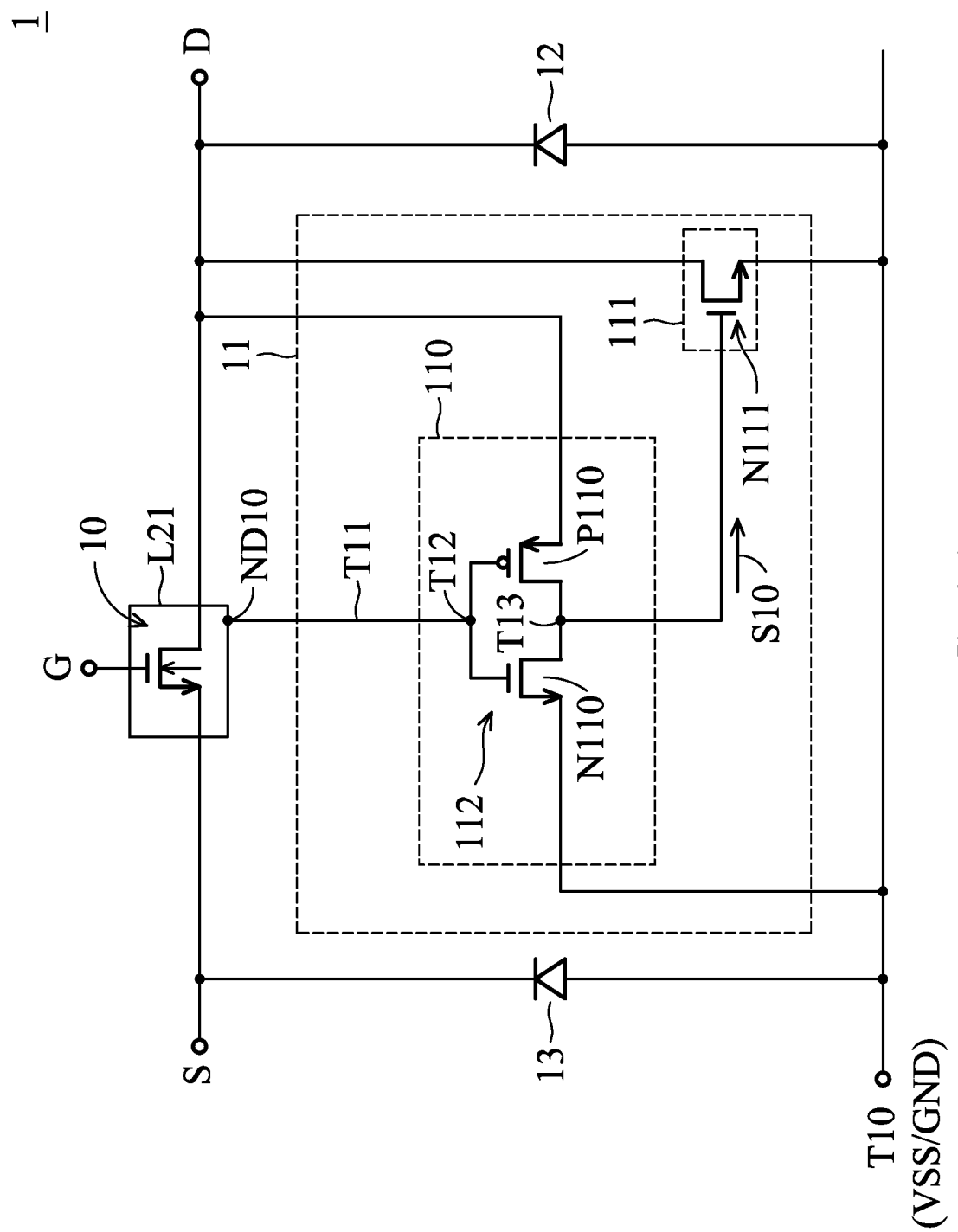
FIG. 1A shows one exemplary embodiment of a semiconductor circuit.
Figure 2A:
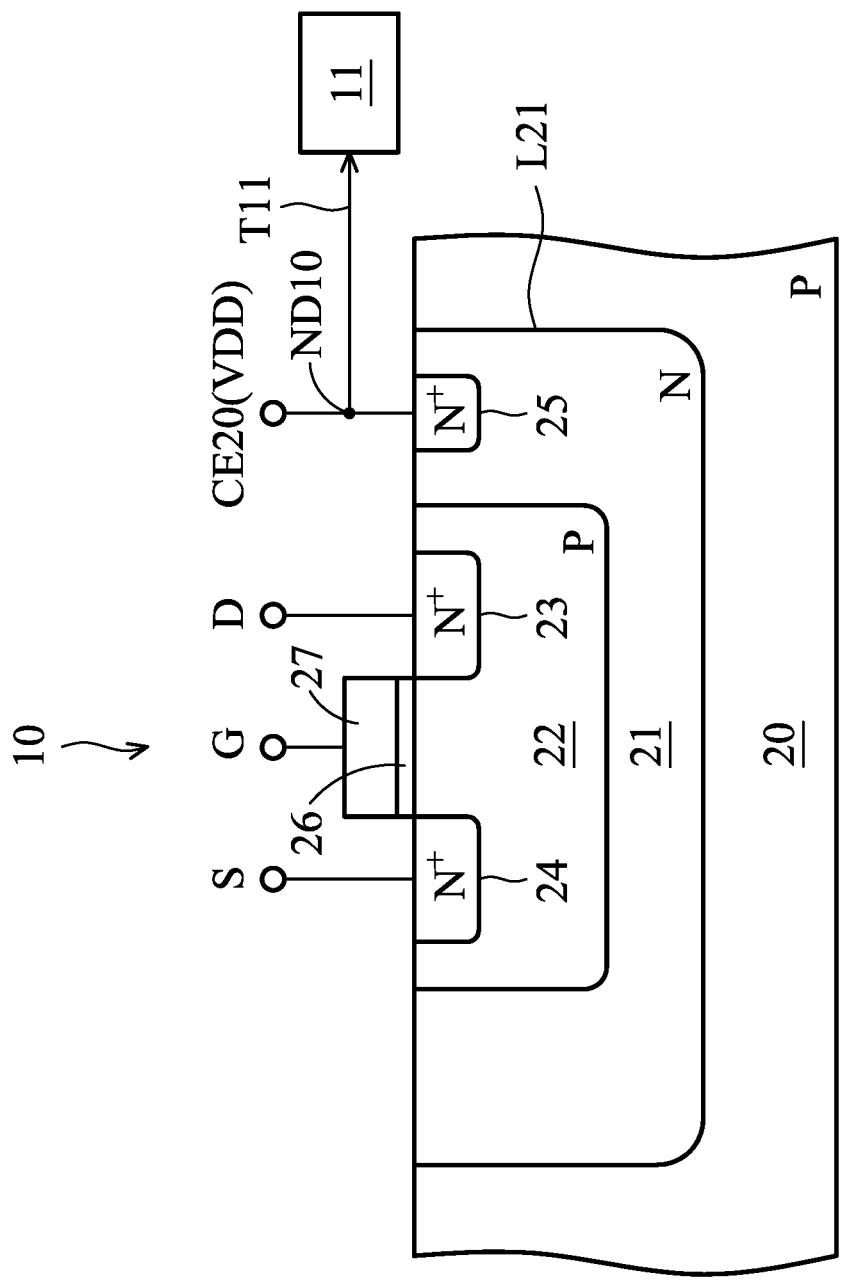
FIG. 2A shows a cross-sectional view of an exemplary embodiment of a structure of a transistor.

FIG. 1A shows one exemplary embodiment of a semiconductor circuit. Referring to FIG. 1A, a semiconductor circuit 1 comprises a semiconductor element 10, an electrostatic discharge protection circuit 11, and diodes 12-13. In the embodiment of FIG. 1A, the semiconductor device 10 is implemented by an N-type transistor, which comprises a gate electrode G, a drain electrode D, and a source electrode S. In the following paragraphs, the embodiments will be described by taking an N-type transistor as the semiconductor element 10 for an example. FIG. 2A shows a cross-sectional view of the structure of the transistor 10.

Referring to FIG. 2A, the transistor 10 is formed on a substrate 20. In an embodiment, the conductivity type of the substrate 20 is P-type. An N-type deep well region 21 is formed in the substrate 20. The label L21 shown in FIG. 2A represents the boundary between the N-type deep well region 21 and the substrate 20. In the N-type deep well region 21, a P-type well region 22 and an N-type doped region 25 are formed. Two N-type doped regions 23 and 24 are formed in the P-type well region 22, and a gate dielectric layer 26 is formed on the substrate 20 and between the N-type doped regions 23 and 24. In the embodiment, the position where the N-type doped region 25 is formed in the N-type deep well region 21 is close to the N-type doped region 23. A gate layer 27 is formed on the gate dielectric layer 26. The gate layer 27 is a metal layer or a polysilicon layer. The N-type doped regions 23 and 24 and the gate layer 27 form the transistor 10. Referring to FIGS. 1A and 2A, the N-type doped region 23 serves as the drain region of the transistor 10, and the contact electrode electrically connected to the N-type doped region 23 serves as the drain electrode D. The N-type doped region 24 serves as the source region of the transistor 10, and the contact electrode electrically connected to the N-type doped region 24 serves as the source electrode S. The contact electrode electrically connected to the gate layer 27 serves as the gate electrode G. In the embodiment of the present invention, a contact electrode CE20 is electrically connected to the N-type doped region 25. When the semiconductor circuit 1 is in a normal operation mode, a high operation voltage VDD is supplied to the contact electrode CE20. When the semiconductor circuit 1 is in an abnormal operation mode, the high operation voltage VDD is not supplied to the contact electrode CE20, that is, the potential state of the contact electrode CE20 is a floating state. According to the cross-sectional view shown in FIG. 2A, the transistor 10 is formed in the N-type deep well region 21. In detail, the transistor 10 is surrounded by the N-type deep well region 21. FIG. 1A shows the boundary L21 which surrounds the transistor 10, so as to illustrate the arrangement relationship between the transistor 10 and the N-type deep well region 21 in FIG. 2A.

Referring again to FIG. 1A, the cathode of the diode 12 is electrically connected to the drain electrode D of the transistor 10, and the anode thereof is electrically connected to a power terminal T10. The cathode of the diode 13 is electrically connected to the source electrode S of the transistor 10, and the anode thereof is electrically connected to the power terminal T10. When the semiconductor circuit 1 is in the normal operation mode, a low operation voltage VSS or a ground voltage GND is provided to the power terminal T10 (in the following paragraphs, the low operation voltage VSS will be used as an example to illustrate the embodiments of the present invention). When the semiconductor circuit 1 is in the abnormal operation mode, no voltage is provided to the power terminal T10, that is, the potential state of the power terminal T10 is a floating state.

Referring to FIGS. 1A and 2A, the electrostatic discharge protection circuit 11 is electrically connected to the drain electrode D and comprises a control circuit 110 and a discharge circuit 111. The control circuit 110 comprises a control terminal T11 which is electrically connected to the contact electrode CE20 at a node ND10. In the embodiment, the control circuit 110 further comprises an inverter 112. The inverter 112 comprises an input terminal T12 and an output terminal T13, and the input terminal T12 is electrically connected to the control terminal T11 of the control circuit 11. The inverter 112 further comprises a P-type transistor P110 and an N-type transistor N110. The gate electrode of the transistor P110 is electrically connected to the input terminal T12, the source electrode thereof is electrically connected to the drain electrode D of the transistor 10, and the drain electrode thereof is electrically connected to the output terminal T13. The gate electrode of the transistor N110 is electrically connected to the input terminal T12, the drain electrode thereof is electrically connected to the output terminal T13, and the source electrode thereof is electrically connected to the power terminal T10. The discharge circuit 111 comprises an N-type transistor N111. The gate electrode of the transistor N111 is electrically connected to the output terminal T13 of the inverter 112, the drain electrode thereof is electrically connected to the drain electrode D of the transistor 10, and the source electrode thereof is electrically connected to the power terminal T10. Based on the structure of the control circuit 110 and the connection structure of the transistor 10, the control circuit 110 selectively uses the potential state of the drain electrode D or the potential state of the power terminal T10 based on the potential state of the N-type deep well region 21 to generate a control signal S10. The related description will be shown in the following paragraphs.

When the semiconductor circuit 1 is in the abnormal operation mode, the high operation voltage VDD is not supplied to the contact electrode CE20, and no voltage is supplied to the power terminal T10, that is, both of the potential states of the contact electrode CE20 and the power supply terminal T10 are a floating state. Since the input terminal T12 of the inverter 112 is electrically connected to the contact electrode CE20 through the control terminal T11 and the node ND10, the input terminal T12 is also at a floating state, so that the transistor P110 is turned on while the transistor N110 is turned off. When an electrostatic discharge event occurs on the drain electrode D, the potential of the drain electrode D increases instantly. Through the turned-on transistor P110, the output terminal T13 is at a high-potential state, that is, the control signal S10 has a high-voltage level. The transistor N111 is turned on according to the control signal S10 with the high-voltage level, so that there is a discharge path between the drain electrode D and the power terminal T10. The electrostatic charges on the drain electrode D are conducted to the power terminal T10 through the discharge path, thereby protecting the circuits or elements coupled to the transistor 10 from be damaged by the electrostatic charges.

In the embodiment, when the semiconductor circuit 1 is in then abnormal operation mode and an electrostatic discharge event occurs on the drain electrode D, another discharge path is formed between the power terminal T10 and the source electrode S due to the turned-on transistor N111 and the connection structure of the diode 13 (the anode of the diode 13 being electrical connected to the power terminal T10, and the cathode thereof being electrically connected to the source electrode S). Therefore, when an electrostatic discharge event occurs on the drain electrode D, the electrostatic charges on the drain electrode D are conducted not only to the source electrode S but also to the power terminal T10.

When the semiconductor circuit 1 is in the normal operating mode, the high operation voltage VDD is supplied to the contact electrode CE20, and the low operation voltage VSS is supplied to the power terminal T10, that is, the contact electrode CE20 is in a high-potential state while the power terminal T10 is in a low-potential state. In the normal operation mode, since the input terminal T12 of the inverter 112 is electrically connected to the contact electrode CE20 through the control terminal T11 and the node ND10, the input terminal T12 is in a high-potential state, so that the transistor N110 is turned on while the transistor P110 is turned off. The output terminal T13 is at a low-potential state based on the low operation voltage VSS, that is, the control signal S10 has a low-voltage level. The transistor N111 is turned off according to the control signal S10 with the low-voltage level. In the normal operation mode, since the transistor N111 is turned off, there is no discharge path between the drain electrode D and the power terminal T10, that is, the aforementioned discharge path is cut off.

Figure 1B:
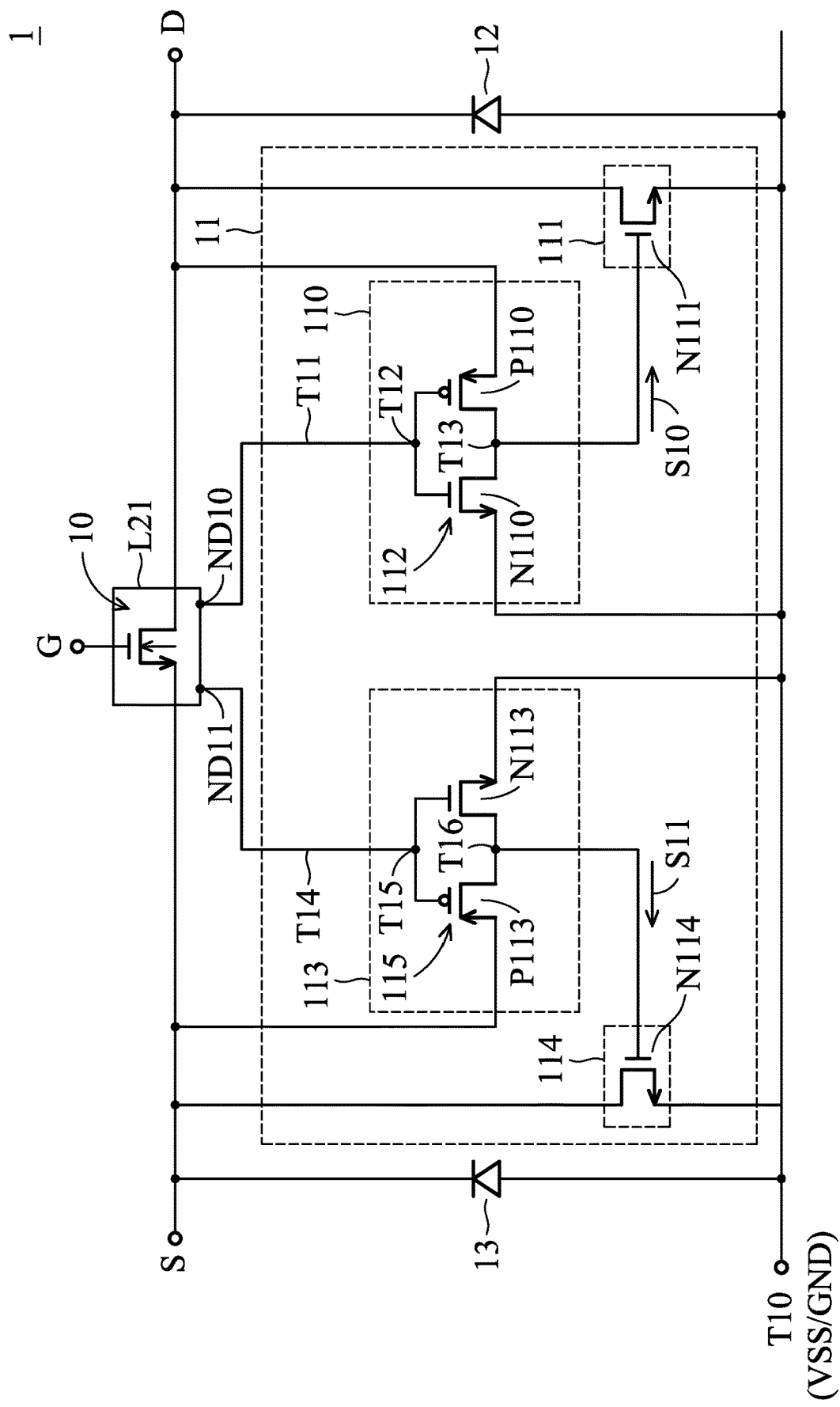
FIG. 1B shows another exemplary embodiment of a semiconductor circuit.
Figure 2B:
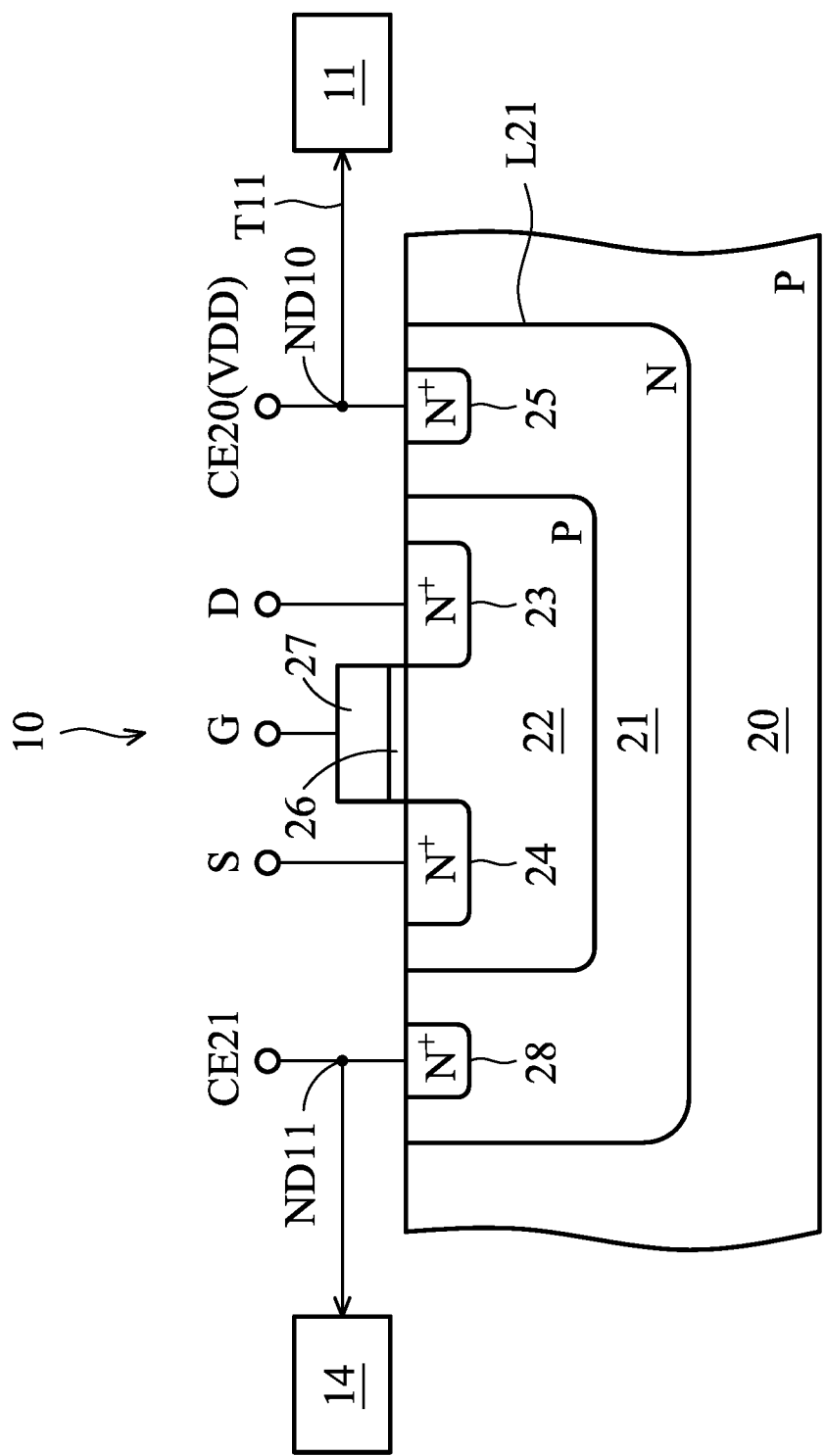
FIG. 2B shows a cross-sectional view of another exemplary embodiment of a structure of a transistor.

In another embodiment, the electrostatic discharge protection circuit 11 is also electrically connected to the source electrode S. In the embodiment, as shown in FIG. 2B, an N-type doped region 28 is further formed in the N-type deep well region 21, and a contact electrode CE21 is electrically connected to the N-type doped region 28. When the semiconductor circuit 1 is in the normal operation mode, the high operation voltage VDD is supplied to the contact electrode CE21; when the semiconductor circuit 1 is in the abnormal operation mode, the high operation voltage VDD is not supplied to the contact electrode CE21, that is, the potential state of the contact electrode CE21 is a floating state. In this embodiment, the position where the N-type doped region 28 is formed in the N-type deep well region 21 is close to the N-type doped region (source region) 24. Referring to FIG. 1B, the electrostatic discharge protection circuit 11 further comprises a control circuit 113 and a discharge circuit 114. The control circuit 113 comprises a control terminal T14 which is electrically connected to the contact electrode CE21 at a node ND11. The control circuit 113 further comprises an inverter 115. The inverter 115 comprises an input terminal T15 and an output terminal T16, and the input terminal T15 is electrically connected to the control terminal T14 of the control circuit 113. The inverter 115 further comprises a P-type transistor P113 and an N-type transistor N113. The gate electrode of the transistor P113 is electrically connected to the input terminal T15, the source electrode thereof is electrically connected to the source electrode S of the transistor 10, and the drain electrode thereof is electrically connected to the output terminal T16. The gate electrode of the transistor N113 is electrically connected to the input terminal T15, the drain electrode thereof is electrically connected to the output terminal T16, and the source electrode thereof is electrically connected to the power terminal T10. The discharge circuit 114 comprises an N-type transistor N114. The gate electrode of the transistor N114 is electrically connected to the output terminal T16 of the inverter 115, the drain electrode thereof is electrically connected to the source electrode S of the transistor 10, and the source electrode thereof is electrically connected to the power terminal T10. Based on the structure of the control circuit 113 and the connection of the transistor 10, the control circuit 113 generates a control signal S11 based on the potential state of the N-type deep well region 21 and according to the potential state of the source electrode S or the potential state of the power terminal T10. The related description will be shown in the following paragraphs.

When the semiconductor circuit 1 is in the abnormal operation mode, the high operation voltage VDD is not supplied to the contact electrode CE21, and no voltage is supplied to the power terminal T10, that is, both of the potential states of the contact electrode CE21 and the power terminal T10 are a floating state. Since the input terminal T15 of the inverter 115 is electrically connected to the contact electrode CE21 through the control terminal T14 and the node ND11, the input terminal T15 is also at a floating state, so that the transistor P113 is turned on while the transistor N113 is turned off. When an electrostatic discharge event occurs on the source electrode S, the potential of the source electrode S increases instantly. Through the turned-on transistor P113, the output terminal T16 is at a high-potential state, that is, the control signal S11 has a high-voltage level. The transistor N114 is turned on according to the control signal S11 with the high-voltage level, so that there is a discharge path between the source electrode S and the power terminal T10. The electrostatic charges on the source electrode S are conducted to the power terminal T10 through the discharge path, thereby protecting the circuits or elements coupled to the transistor 10 from the be damaged by the electrostatic charges.

In the embodiment, when the semiconductor circuit 1 is in the abnormal operation mode and an electrostatic discharge event occurs on the source electrode S, another discharge path is formed between the power terminal T10 and the drain electrode D due the turned-on transistor N114 and the connection structure of the diode 12 (the anode of the diode 13 being connected to the power terminal T10, and the cathode thereof being electrically connected to the drain electrode D). Therefore, when an electrostatic discharge event occurs on the source electrode S, the electrostatic charges on the source electrode S are conducted not only to the drain electrode D but also to the power terminal T10.

When the semiconductor circuit 1 is in the normal operation mode, the high operation voltage VDD is supplied to the contact electrode CE21, and the low operation voltage VSS is supplied to the power terminal T10, that is, the contact electrode CE21 is at a high-potential state while the power terminal T10 is at a low-potential state. In the normal operation mode, since the input terminal T15 of the inverter 115 is electrically connected to the contact electrode CE21 through the control terminal T14 and the node ND11, the input terminal T15 is at a high-potential state, so that the transistor N113 is turned on while the transistor P113 is turned off. The output terminal T16 is at a low-potential state based on the low operation voltage VSS, that is, the control signal S11 has a low-voltage level. The transistor N114 is turned off according to the control signal S11 with the low-voltage level. In the normal operation mode, since the transistor N114 is turned off, there is no discharge path between the source electrode S and the power terminal T10, that is, the aforementioned discharge path is cut off.

Figure 3:
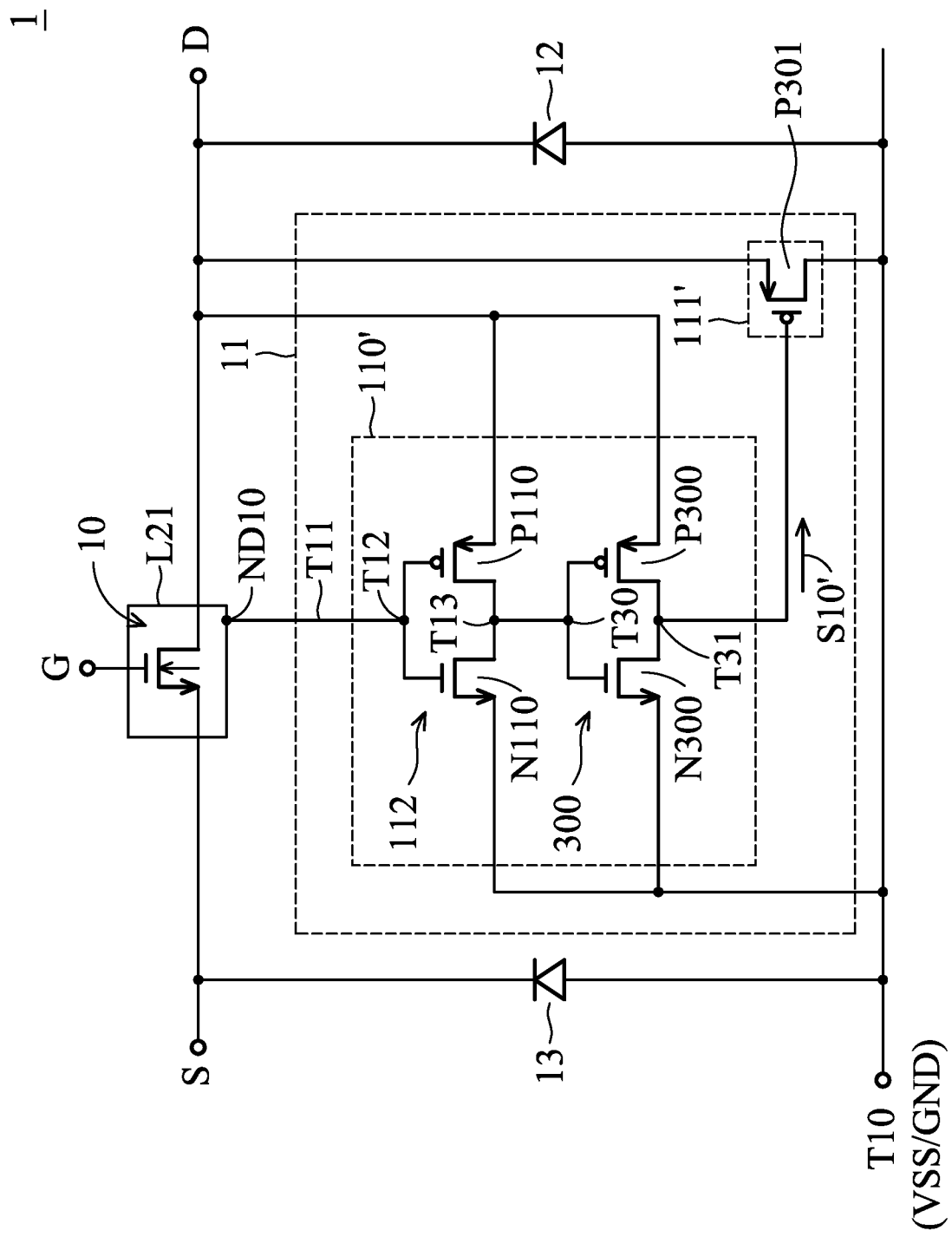
FIG. 3 shows another exemplary embodiment of a semiconductor circuit.

In other embodiments, the electrostatic discharge protection circuit electrically connected to the drain electrode D of the transistor 10 comprises another circuit structure. Referring to FIGS. 1A and 3, compared with the circuit structure shown in FIG. 1A, the control circuit 110' of the electrostatic discharge circuit 11 in FIG. 3 further comprises an inverter 300. The inverter 300 comprises an input terminal T30 and an output terminal T31, and the input terminal T30 is electrically connected to the output terminal T13 of the inverter 112. The inverter 300 further comprises a P-type transistor P300 and an N-type transistor N300. The gate electrode of the transistor P300 is electrically connected to the input terminal T30, the source electrode thereof is electrically connected to the drain electrode D of the transistor 10, and the drain electrode thereof is electrically connected to the output terminal T31. The gate electrode of the transistor N300 is electrically connected to the input terminal T30, the drain electrode thereof is electrically connected to the output terminal T31, and the source electrode thereof is electrically connected to the power terminal T10. In addition, based on the structure of the control circuit 110', the discharge circuit 111' of the ESD circuit 11 in FIG. 3 further comprises a P-type transistor P301 instead of the N-type transistor N111 shown in FIG. 1A. Referring to FIG. 3, the gate electrode of the transistor P301 is electrically connected to the output terminal T31 of the inverter 300, the source electrode thereof is electrically connected to the drain electrode D of the transistor 10, and the drain electrode thereof is electrically connected to the power terminal T10.

Referring to the description related to FIG. 1A above, in the abnormal operation mode, the high operation voltage VDD is not provided to the contact electrode CE20, and no voltage is supplied to the power terminal T10, that is, both of the potential states of the contact electrode CE20 and the power terminal T10 are a floating state. When an electrostatic discharge event occurs on the drain electrode D, the output terminal T13 of the inverter 112 is at a high-potential state. According to the high-potential state of the output terminal T13, the transistor N300 is turned on while the transistor P300 is turned off Through the turned-on transistor N300, the output terminal T31 is at a low-potential state based on the floating state of the power terminal T10, that is, the control signal S10' has a low-voltage level. The transistor P301 is turned on according to the control signal S10' with the low-voltage level, so that there is a discharge path between the drain electrode D and the power terminal T10. The electrostatic charges on the drain electrode D are conducted to the power terminal T10 through the discharge path, thereby protecting the circuits or elements coupled to the transistor 10 from being damaged by the electrostatic charges.

In this embodiment, when the semiconductor circuit 1 is in the abnormal operation mode and an electrostatic discharge event occurs on the drain electrode D, another discharge path is formed between the power terminal T10 and the source electrode S due to the turned-on transistor P301 and the connection structure of the diode 13 (the anode of the diode 13 being electrical connected to the power terminal T10, and the cathode thereof being electrically connected to the source electrode S). Therefore, when an electrostatic discharge event occurs on the drain electrode D, the electrostatic charges on the drain electrode D are conducted not only to the source electrode S but also to the power terminal T10.

Similarly, referring to the previous description related to FIG. 1A, when the semiconductor circuit 1 is in the normal operation mode, the high operation voltage VDD is supplied to the contact electrode CE20, and the low operation voltage VSS is supplied to the power terminal T10, that is, the contact electrode CE20 is at a high-potential state while the power terminal T10 is at a low-potential state. In the normal operation mode, the output terminal T13 is at a low-potential state. According to the low-potential state of the output terminal T13, the transistor P300 is turned on, and the transistor N300 is turned off. Through the turned-on transistor P300, the output terminal T31 is at a high-potential state based on the potential of the drain electrode D of the transistor 10 which is operating, that is, the control signal S10' has a high-voltage level. The transistor P301 is turned off according to the control signal S10' with the high-voltage level. In the normal operation mode, since the transistor P301 is turned off, there is no discharge path between the drain electrode D and the power terminal T10, that is, the aforementioned discharge path is cut off.

According to the above-mentioned embodiments, the electrostatic discharge protection circuit provided by the present invention does not have a capacitor-resistance circuit used in the prior art, so it occupies a smaller area.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection circuit for a semiconductor element, the semiconductor element comprising a first drain/source electrode and a second drain/source electrode and surrounded by a deep well region, the electrostatic discharge protection circuit comprising:
    a first control circuit electrically connected between the first drain/source electrode of the semiconductor element and a power terminal and comprising a first control terminal, wherein the first control terminal is electrically connected to the deep well region, and the first control circuit generates a first control signal; and
    a first discharge circuit electrically connected between the first drain/source electrode and the power terminal and controlled by the first control signal,
    wherein when an electrostatic discharge event occurs on the first drain/source electrode, the first control circuit generates the first control signal according to a potential state of the deep well region and a potential state of the first drain/source electrode, and the first discharge circuit provides a first discharge path between the first drain/source electrode and the power terminal according to the first control signal.

2. The electrostatic discharge protection circuit as claimed in claim 1, wherein the first control circuit comprises:
    a first inverter electrically connected between the first drain/source electrode and the power terminal and comprising a first input terminal and a first output terminal,
    wherein the first input terminal is electrically connected to the first control terminal, and
    wherein the first inverter selectively uses the potential state of the first drain/source electrode or a potential state of the power terminal based on the potential state of the deep well region to determine a voltage of the first output terminal, and the first control circuit generates the first control signal according to the voltage of the first output terminal.

3. The electrostatic discharge protection circuit as claimed in claim 2, wherein when an electrostatic discharge event occurs on the first drain/source electrode, the first inverter generates the first control signal according to the potential state of the first drain/source electrode.

4. The electrostatic discharge protection circuit as claimed in claim 3 wherein the electrostatic discharge event occurs during a period when the potential state of the deep well region is a floating state.

5. The electrostatic discharge protection circuit as claimed in claim 2, wherein when the semiconductor element is in a normal operation mode, the first inverter generates the first control signal according to the potential state of the power terminal to control the discharge circuit to cut off the first discharge path.

6. The electrostatic discharge protection circuit as claimed in claim 5, wherein in the normal operation mode, the deep well region receives an operation voltage.

7. The electrostatic discharge protection circuit as claimed in claim 2, wherein the first inverter comprises:
    a first P-type transistor having a control electrode electrically connected to the first input terminal, a first electrode electrically connected to the first drain/source electrode, and a second electrode electrically connected to the first output terminal; and
    a first N-type transistor having a control electrode electrically connected to the first input terminal, a first electrode electrically connected to the first output terminal, and a second electrode electrically connected to the power terminal.

8. The electrostatic discharge protection circuit as claimed in claim 7, wherein the first discharge circuit comprises:
    a second N-type transistor having a control electrode electrically connected to the first output terminal, a first electrode electrically connected to the first drain/source electrode, and a second electrode electrically connected to the power terminal.

9. The electrostatic discharge protection circuit as claimed in claim 2, wherein the first control circuit further comprises:

a second inverter electrically connected to the first drain/source electrode and the power terminal and comprising a second input terminal and a second output terminal, wherein the second input terminal is electrically connected to the first output terminal, and wherein the second inverter selectively uses the potential state of the first drain/source electrode or the potential state of the power terminal based on the voltage of the first output terminal to generate the first control signal.

10. The electrostatic discharge protection circuit as claimed in claim 1, further comprising:

a second control circuit electrically connected between the second drain/source electrode of the semiconductor element and the power terminal and comprising a second control terminal, wherein the second control terminal is electrically connected to the deep well region, and the second control circuit generates a second control signal; and a second discharge circuit electrically connected between the second drain/source electrode and the power terminal and controlled by the second control signal, wherein when the electrostatic discharge event occurs on the second drain/source electrode, the second control circuit generates the second control signal according to the potential state of the deep well region and a potential state of the second drain/source electrode, and the second discharge circuit provides a second discharge path between the second drain/source electrode and the power terminal according to the second control signal.

11. The electrostatic discharge protection circuit as claimed in claim 1, further comprising:

a diode having an anode electrically connected to the power terminal and a cathode electrically connected to the second drain/source electrode, wherein when the electrostatic discharge event occurs on the first drain/source electrode, a second discharge path is formed between the power terminal and the second drain/source electrode through the diode.

12. A semiconductor circuit comprising:

a semiconductor element formed in a well region and comprising a first drain/source electrode and a second drain/source electrode, wherein the well region is surrounded by a deep well region, the well has a first conductivity type, and the deep well region has a second conductivity type different from the first conductivity type;

a first control circuit electrically connected between the first drain/source electrode of the semiconductor element and a power terminal and comprising a first control terminal, wherein the first control terminal is electrically connected to the deep well region, and the first control circuit generates a first control signal; and a first discharge circuit electrically connected between the first drain/source electrode and the power terminal and controlled by the first control signal, wherein when an electrostatic discharge event occurs on the first drain/source electrode, the first control circuit generates the first control signal according to a potential state of the deep well region and a potential state of the first drain/source electrode, and the first discharge circuit provides a first discharge path between the first drain/source electrode and the power terminal according to the first control signal.

13. The semiconductor circuit as claimed in claim 12, wherein the first control circuit comprises:

a first inverter electrically connected between the first drain/source electrode and the power terminal and comprising a first input terminal and a first output terminal, wherein the first input terminal is electrically connected to the first control terminal, and wherein the first inverter selectively uses the potential state of the first drain/source electrode or a potential state of the power terminal based on the potential state of the deep well region to determine a voltage of the first output terminal, and the first control circuit generates the first control signal according to the voltage of the first output terminal.

14. The semiconductor circuit as claimed in claim 13, wherein when an electrostatic discharge event occurs on the first drain/source electrode, the first inverter generates the first control signal according to the potential state of the first drain/source electrode.

15. The semiconductor circuit as claimed in claim 14 wherein the electrostatic discharge event occurs during a period when the potential state of the deep well region is a floating state.

16. The semiconductor circuit as claimed in claim 13, wherein when the semiconductor element is in a normal operation mode, the first inverter generates the first control signal according to the potential state of the power terminal to control the discharge circuit to cut off the first discharge path.

17. The semiconductor circuit as claimed in claim 16, wherein in the normal operation mode, the deep well region receives an operation voltage.

18. The semiconductor circuit as claimed in claim 13, wherein the first inverter comprises:

a first P-type transistor having a control electrode electrically connected to the first input terminal, a first electrode electrically connected to the first drain/source electrode, and a second electrode electrically connected to the first output terminal; and a first N-type transistor having a control electrode electrically connected to the first input terminal, a first electrode electrically connected to the first output terminal, and a second electrode electrically connected to the power terminal.

19. The semiconductor circuit as claimed in claim 18, wherein the first discharge circuit comprises:

a second N-type transistor having a control electrode electrically connected to the first output terminal, a first electrode electrically connected to the first drain/source electrode, and a second electrode electrically connected to the power terminal.

20. The semiconductor circuit as claimed in claim 13, wherein the first control circuit further comprises:

a second inverter electrically connected to the first drain/source electrode and the power terminal and comprising a second input terminal and a second output terminal, wherein the second input terminal is electrically connected to the first output terminal, and wherein the second inverter selectively uses the potential state of the first drain/source electrode or the potential state of the power terminal based on the voltage of the first output terminal to generate the first control signal.

21. The semiconductor circuit as claimed in claim 12, further comprising:

a second control circuit electrically connected between the second drain/source electrode of the semiconductor element and the power terminal and comprising a second control terminal, wherein the second control terminal is electrically connected to the deep well region, and the second control circuit generates a second control signal; and a second discharge circuit electrically connected between the second drain/source electrode and the power terminal and controlled by the second control signal, wherein when the electrostatic discharge event occurs on the second drain/source electrode, the second control circuit generates the second control signal according to the potential state of the deep well region and a potential state of the second drain/source electrode, and the second discharge circuit provides a second discharge path between the second drain/source electrode and the power terminal according to the second control signal.

22. The semiconductor circuit as claimed in claim 12, further comprising:

a diode having an anode electrically connected to the power terminal and a cathode electrically connected to the second drain/source electrode, wherein when the electrostatic discharge event occurs on the first drain/source electrode, a second discharge path is formed between the power terminal and the second drain/source electrode through the diode.

\* \* \* \* \*